US012596856B2

(12) United States Patent
Chu et al.

(10) Patent No.: US 12,596,856 B2
(45) Date of Patent: Apr. 7, 2026

(54) ASSET EVALUATION SYSTEM FOR AUTONOMOUS VEHICLE SIMULATIONS

(71) Applicant: GM Cruise Holdings LLC, San Francisco, CA (US)

(72) Inventors: Jacqueline Chu, Danville, CA (US); Richard Stenson, Miami, FL (US); Benjamin Goldstein, San Francisco, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 1143 days.

(21) Appl. No.: 17/555,752

(22) Filed: Dec. 20, 2021

(65) Prior Publication Data

US 2023/0195968 A1      Jun. 22, 2023

(51) Int. Cl.
| | |
|---|---|
| *G06F 30/27* | (2020.01) |
| *B60W 60/00* | (2020.01) |
| *G01S 17/89* | (2020.01) |
| *G01S 17/931* | (2020.01) |
| *G06T 19/00* | (2011.01) |
| *G07C 5/08* | (2006.01) |

(52) U.S. Cl.
CPC ............. *G06F 30/27* (2020.01); *B60W 60/00* (2020.02); *G01S 17/89* (2013.01); *G01S 17/931* (2020.01); *G06T 19/00* (2013.01); *G07C 5/085* (2013.01)

(58) Field of Classification Search
CPC ............................... G06F 30/27; B60W 60/00
See application file for complete search history.

(56) References Cited

U.S. PATENT DOCUMENTS

| | | | |
|---|---|---|---|
| 2015/0175168 A1* | 6/2015 | Hoye .................... | B60W 40/09 |
| | | | 434/64 |
| 2019/0258878 A1* | 8/2019 | Koivisto .............. | G06V 10/774 |
| 2021/0286924 A1* | 9/2021 | Wyrwas ................. | G06F 30/15 |

OTHER PUBLICATIONS

Deter (Deter, D., Wang, C., Cook, A., & Perry, N. K. (2020). Simulating the autonomous future: a look at virtual vehicle environments and how to validate simulation using public data sets. IEEE Signal Processing Magazine, 38(1), 111-121.) (Year: 2020).*

* cited by examiner

*Primary Examiner* — Bijan Mapar
(74) *Attorney, Agent, or Firm* — CANTOR COLBURN LLP

(57) ABSTRACT

Systems, methods, and computer-readable media are disclosed for a quick evaluation system for three-dimensional (3D) assets used in simulations for an autonomous vehicle (AV). A disclosed method comprises receiving drive data recorded in a physical environment by a vehicle having a first sensor; simulating the first sensor associated with a virtual autonomous vehicle in a virtual environment of a 3D scene including an object that at least partially corresponds to the physical environment; evaluating simulated data based on the simulation of the first sensor using a machine learning (ML) model; comparing evaluation data recorded during the evaluation of the simulation of the first sensor using the ML model to the drive data recorded in the physical environment; and generating a report based on a comparison of the evaluation data to a portion of the drive data to determine metrics associated with the object in the virtual environment.

20 Claims, 6 Drawing Sheets

200

500

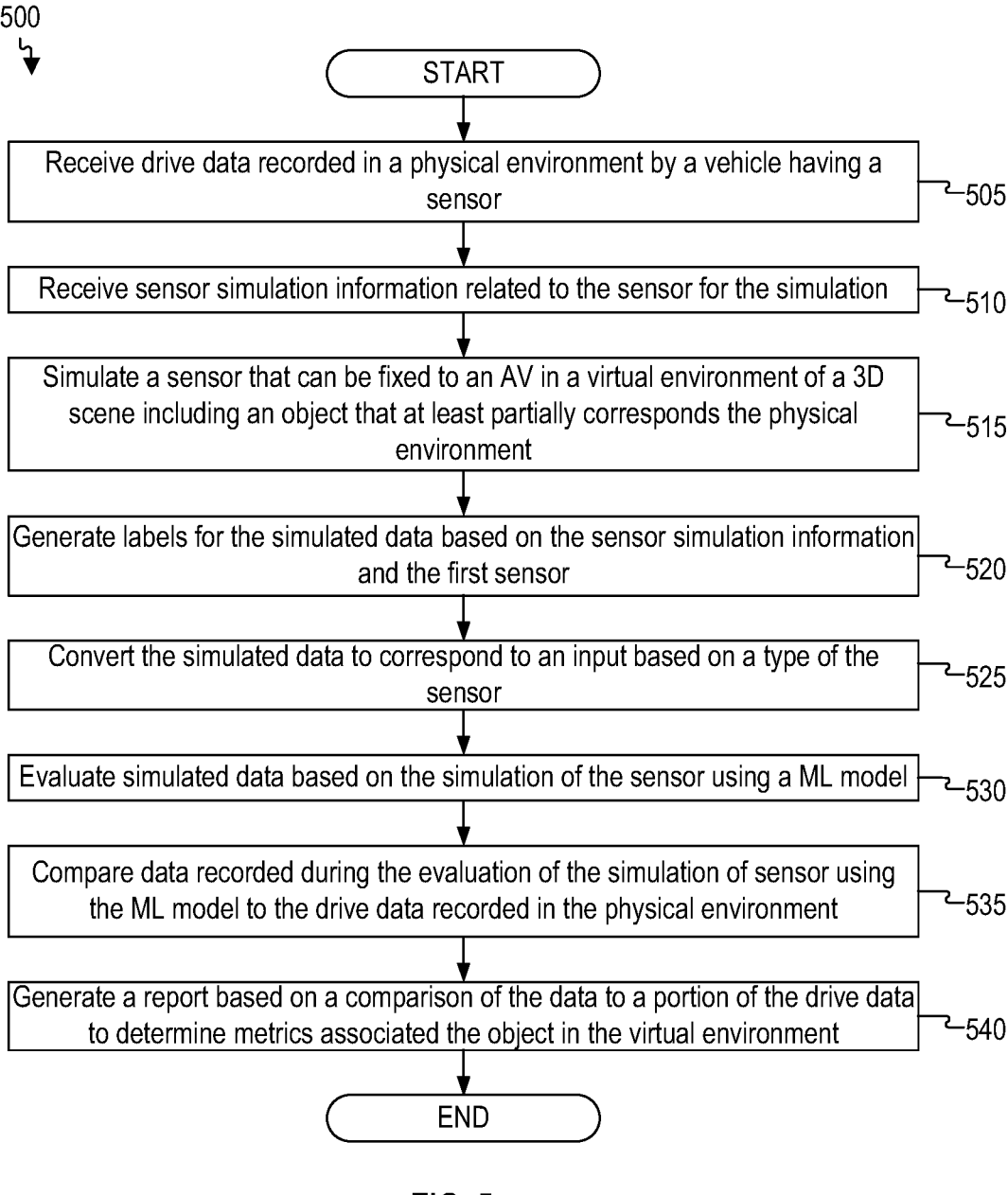

START

Receive drive data recorded in a physical environment by a vehicle having a sensor ⌐~505

Receive sensor simulation information related to the sensor for the simulation ⌐~510

Simulate a sensor that can be fixed to an AV in a virtual environment of a 3D scene including an object that at least partially corresponds the physical environment ⌐~515

Generate labels for the simulated data based on the sensor simulation information and the first sensor ⌐~520

Convert the simulated data to correspond to an input based on a type of the sensor ⌐~525

Evaluate simulated data based on the simulation of the sensor using a ML model ⌐~530

Compare data recorded during the evaluation of the simulation of sensor using the ML model to the drive data recorded in the physical environment ⌐~535

Generate a report based on a comparison of the data to a portion of the drive data to determine metrics associated the object in the virtual environment ⌐~540

END

FIG. 5

ASSET EVALUATION SYSTEM FOR AUTONOMOUS VEHICLE SIMULATIONS

TECHNICAL FIELD

The subject technology is related to autonomous driving vehicles and, in particular, an asset evaluation system for autonomous vehicle simulations.

BACKGROUND

Autonomous vehicles are vehicles having computers and control systems that perform driving and navigation tasks that are conventionally performed by a human driver. As autonomous vehicle technologies continue to advance, ride-sharing services will increasingly utilize autonomous vehicles to improve service efficiency and safety. However, autonomous vehicles will be required to perform many of the functions that are conventionally performed by human drivers, such as avoiding dangerous or difficult routes, and performing other navigation and routing tasks necessary to provide safe and efficient transportation. Such tasks may require the collection and processing of large quantities of data disposed on the autonomous vehicle.

BRIEF DESCRIPTION OF THE DRAWINGS

The embodiments herein may be better understood by referring to the following description in conjunction with the accompanying drawings in which like reference numerals indicate identically or functionally similar elements, of which:

FIG. 5 is a flowchart of a method performed by a 3D asset evaluation system for improving 3D assets used by a 3D simulator according to an example of the instant disclosure.

DETAILED DESCRIPTION

The detailed description set forth below is intended as a description of various configurations of embodiments and is not intended to represent the only configurations in which the subject matter of this disclosure can be practiced. The appended drawings are incorporated herein and constitute a part of the detailed description. The detailed description includes specific details for the purpose of providing a more thorough understanding of the subject matter of this disclosure. However, it will be clear and apparent that the subject matter of this disclosure is not limited to the specific details set forth herein and may be practiced without these details. In some instances, structures and components are shown in block diagram form in order to avoid obscuring the concepts of the subject matter of this disclosure.

Overview

Systems, methods, and computer-readable media are disclosed for a quick evaluation system for three-dimensional (3D) assets used in simulations for an autonomous vehicle (AV). In some examples, the quick evaluation system provides feedback to determine differences observed by a machine learning (ML) model in the physical world and a simulated or virtual world. Based on the differences, improvements to the objects in the virtual world can be implemented to accurately correspond to the sensor performance in the real world. This improves simulation accuracy and increases the effectiveness of simulations, can be used to create uncommon scenarios to train and evaluate ML models for an AV.

In some examples, a method for evaluating 3D assets is disclosed. The method comprises . . . . In some examples, the disclosed systems, methods, and computer-readable media provide a feedback loop to improve 3D assets and reduces the differences in measured performance (e.g., in the physical world) and simulated performance (e.g., in the virtual world) and improve training and evaluation of the various ML models.

EXAMPLE EMBODIMENTS

Figure 1:
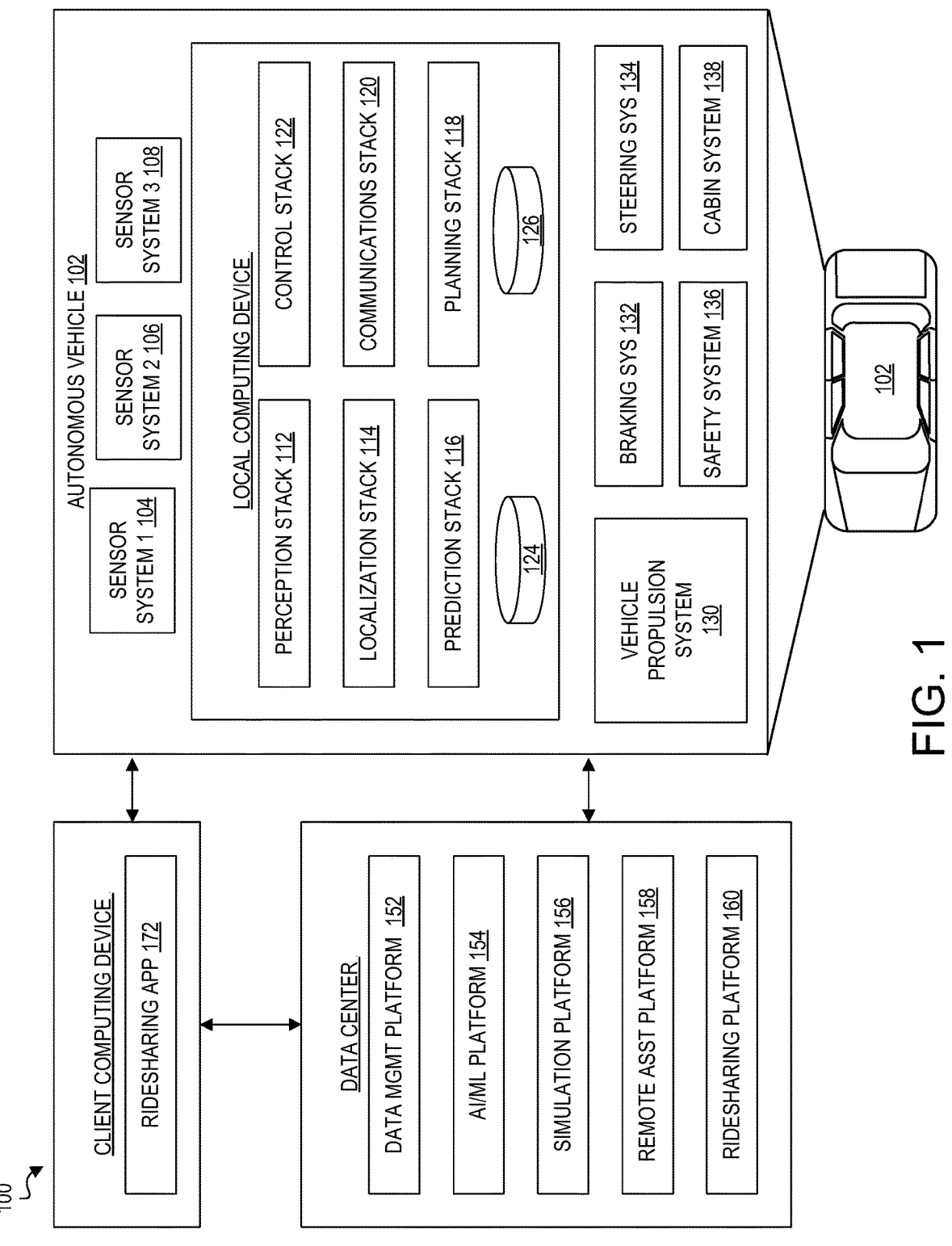
FIG. 1 illustrates an example of a system for managing one or more Autonomous Vehicles (AVs) in accordance with some aspects of the present technology.
Figure 2:
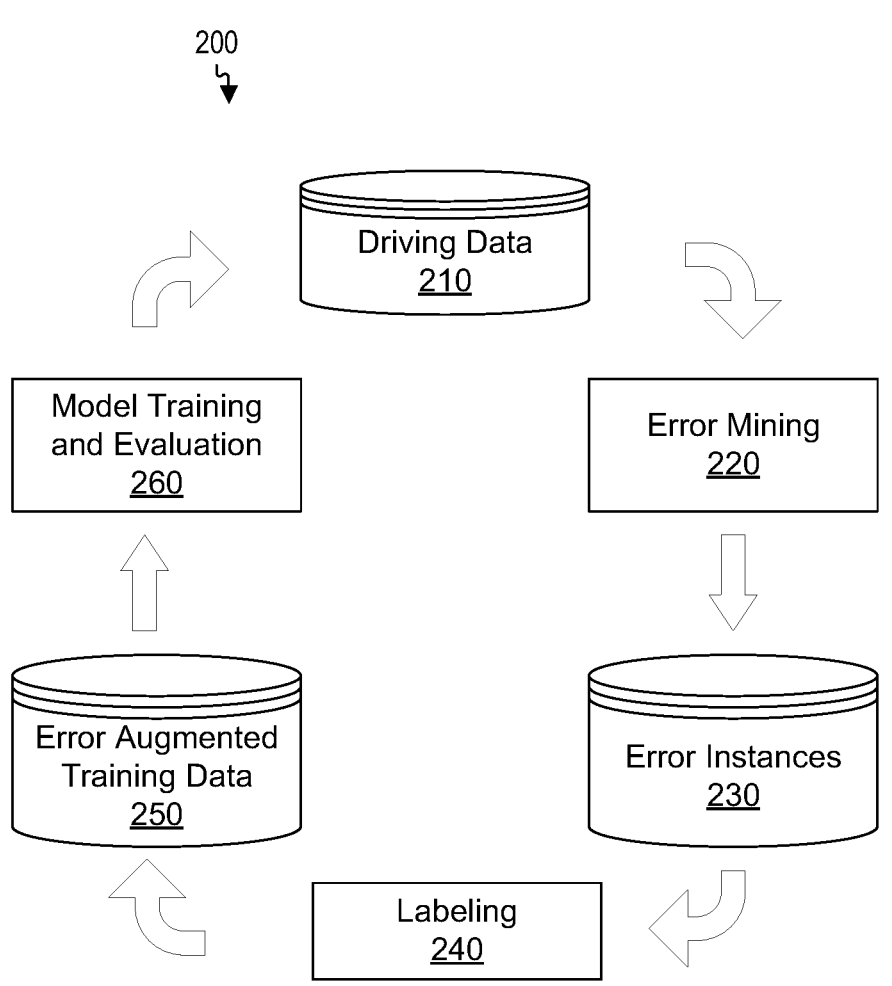
FIG. 2 illustrates an example diagram of a Continuous Learning Machine (CLM) for resolving uncommon scenarios in an AV according to an example of the instant disclosure.
Figure 6:
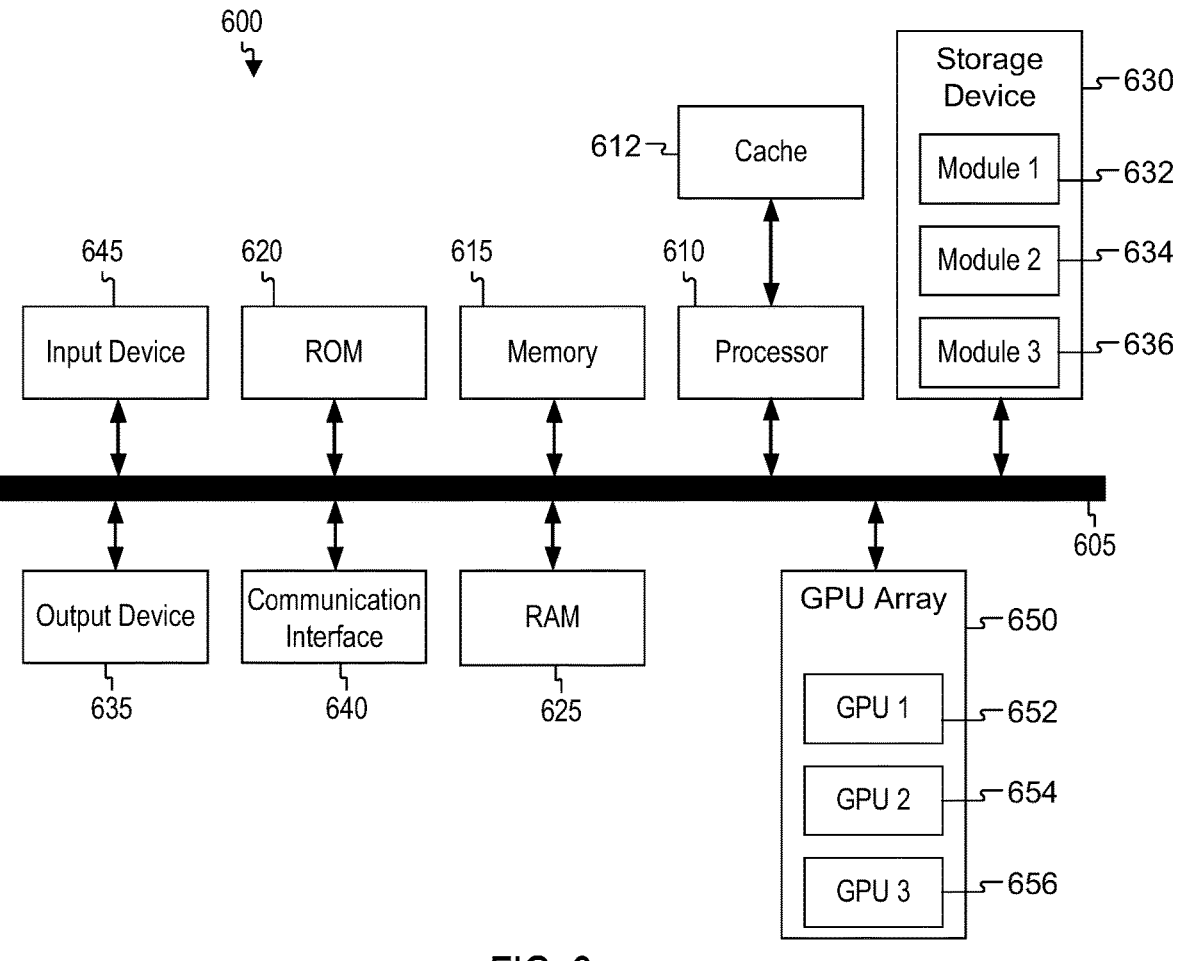
FIG. 6 shows an example of a system for implementing certain aspects of the present technology.

A description of an AV management system and a continual learning machine (CLM) for the AV management system, as illustrated in FIGS. 1 and 2, are first disclosed herein. An overview of a neural network lifecycle is disclosed in FIG. 3. A 3D asset evaluation system for improving 3D assets used by a 3D simulator is disclosed in FIG. 4 and is followed by a method performed by the 3D asset evaluation system in FIG. 5. The discussion then concludes with a brief description of example devices, as illustrated in FIG. 6. These variations shall be described herein as the various embodiments are set forth. The disclosure now turns to FIG. 1.

FIG. 1 illustrates an example of an AV management system 100. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other embodiments may include different numbers and/or types of elements, but one of ordinary skill the art will appreciate that such variations do not depart from the scope of the present disclosure.

In this example, the AV management system 100 includes an AV 102, a data center 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measurement Units (IMUs), cameras (e.g., still image cameras, video cameras, etc.), light sensors (e.g., light detection and ranging (LIDAR) systems, ambient light sensors, infrared sensors, etc.), RADAR systems, global positioning system (GPS) receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other embodiments may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some embodiments, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a prediction stack 116, a planning stack 118, a communications stack 120, a control stack 122, an AV operational database 124, and a high definition (HD) geospatial database 126, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 126, other components of the AV, and other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can also identify environmental uncertainties, such as where to look for moving objects, flag areas that may be obscured or blocked from view, and so forth. In some embodiments, an output of the prediction stack can be a bounding area around a perceived object that can be associated with a semantic label that identifies the type of object that is within the bounding area, the kinematic of the object (information about its movement), a tracked path of the object, and a description of the pose of the object (its orientation or heading, etc.).

The mapping and localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some embodiments, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources.

The prediction stack 116 can receive information from the localization stack 114 and objects identified by the perception stack 112 and predict a future path for the objects. In some embodiments, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

The planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

The control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

The communications stack 120 can transmit and receive signals between the various stacks and other components of the AV 102 and between the AV 102, the data center 150, the client computing device 170, and other remote systems. The communications stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communications stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Bluetooth®, infrared, etc.).

The HD geospatial database 126 can store HD maps and related data of the streets upon which the AV 102 travels. In some embodiments, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes;

etc.). The traffic controls lane can include geospatial information of traffic signal lights, traffic signs, and other road objects and related attributes.

The AV operational database 124 can store raw AV data generated by the sensor systems 104-108, stacks 112 — 122, and other components of the AV 102 and/or data received by the AV 102 from remote systems (e.g., the data center 150, the client computing device 170, etc.). In some embodiments, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

The data center 150 can be a private cloud (e.g., an enterprise network, a co-location provider network, etc.), a public cloud (e.g., an IaaS network, a PaaS network, a SaaS network, or other CSP network), a hybrid cloud, a multi-cloud, and so forth. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, and a ridesharing platform 160, among other systems.

The data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from a cartography platform; modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 172. The client computing device 170 can be a customer's mobile computing device or a computing device integrated with the AV 102 (e.g., the local computing device 110). The ridesharing platform 160 can receive requests to pick up or drop off from the ridesharing application 172 and dispatch the AV 102 for the trip.

FIG. 2 illustrates an example diagram of a CLM 200 that solves long-tail prediction problem in an AV in accordance with some examples. The CLM 200 is a continual loop that iterates and improves based on continual feedback to learn and resolve driving situations experienced by the AV.

The CLM 200 begins with a fleet of AVs that are outfitted with sensors to record a real-world driving scene. In some cases, the fleet of AVs is situated in a suitable environment that represents challenging and diverse situations such as an urban environment to provide more learning opportunities. The AVs record the driving situations into a collection of driving data 210.

The CLM 200 includes an error mining 220 to mine for errors and uses active learning to automatically identify error cases and scenarios having a significant difference between prediction and reality, which are added to a dataset of error instances 230. The error instances are long-tail scenarios that are uncommon and provide rich examples for simulation and training. The error instances 230 store high-value data and prevent storing datasets with situations that are easily resolved.

The CLM 200 also implements a labeling function 240 that includes both automated and manual data annotation of data that is stored in error augmented training data 250 and used for future prediction. The automated data annotation is performed by an ML labeling annotator that uses a neural network trained to identify and label error scenarios in the datasets. Using the ML labeling annotator enables significant scale, cost, and speed improvements that allow the CLM 200 to cover mores scenario of the long tail. The labeling function 240 also includes functionality to allow a human annotator to supplement the ML labeling function. By having both an automated ML labeling function and a manual (human) labeling annotator, the CLM 200 can be populated with dense and accurate datasets for prediction.

The final step of the CLM 200 is model training and evaluation 260. A new model (e.g., a neural network) is trained based on the error augmented training data 250 and the new model is tested extensively using various techniques to ensure that the new model exceeds the performance of the previous model and generalizes well to the nearly infinite variety of scenarios found in the various datasets. The model can also be simulated in a virtual environment and analyzed for performance. Once the new model has been accurately tested, the new model can be deployed in an AV to record driving data 210. The CLM 200 is a continual feedback loop that provides continued growth and learning to provide accurate models for an AV to implement.

In practice, the CLM can handle many uncommon scenarios, but the AV will occasionally need to account for new and infrequency scenarios that would be obvious to a human. For example, an AV may encounter another motorist making an abrupt and sometimes illegal U-turn. The U-turn can be at a busy intersection or could be mid-block, but the U-turn will be a sparse data point as compared to more common behaviors such as moving straight, left turns, right turns, and lane changes. Applying our CLM principles, an initial deployment model may not optimally predict U-turn situations and error situations commonly include U-turns. As the dataset grows and more error scenarios of U-turns are identified, the model can be trained to sufficiently predict a U-turn and allow the AV to accurately navigate this scenario.

The CLM 200 can be applied to any number of scenarios that a human will intuitively recognize including, for example, a K-turn (or a 3-point turn), lane obstructions, construction, pedestrians, animated objects, animals, emergency vehicles, funeral processions, jaywalking, and so forth. The CLM 200 provides a mechanism for continued learning to account for diverse scenarios that are present in the physical world.

Figure 3:
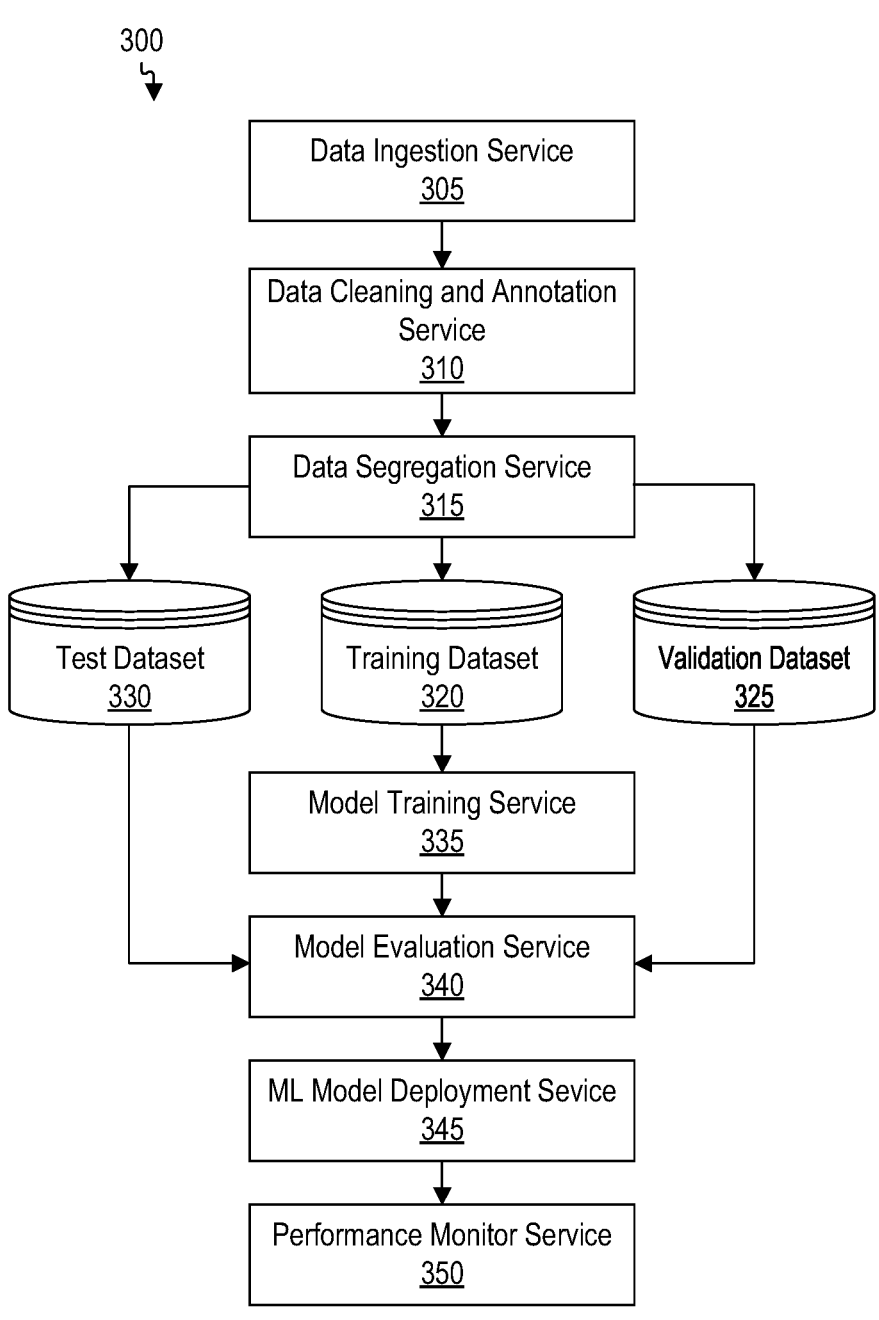
FIG. 3 illustrates an example lifecycle of a machine learning (ML) model according to an example of the instant disclosure.

FIG. 3 illustrates an example lifecycle 300 of a ML model in accordance with some examples. The first stage of the lifecycle 300 of a ML model is a data ingestion service 305 to generate datasets described below. ML models require a significant amount of data for the various processes described in FIG. 3 and the data persisted without undertaking any transformation to have an immutable record of the original dataset. The data itself can be generated by sensors attached to an AV, for example, but can also be provided from third party sources such as publicly available dedicated datasets used for research purposes. The data ingestion service 305 provides a service that allows for efficient querying and end-to-end data lineage and traceability based on a dedicated pipeline for each dataset, data partitioning to take advantage of the multiple servers or cores, and spreading the data across multiple pipelines to reduce the overall time to reduce data retrieval functions.

In some cases, the data may be retrieved offline that decouples the producer of the data (e.g., an AV) from the consumer of the data (e.g., an ML model training pipeline). For offline data production, when source data is available from the producer (e.g., the AV), the producer publishes a message and the data ingestion service 305 retrieves the data. In some examples, the data ingestion service 305 may be online and the data is streamed from the producer (e.g., the AV) in real-time for storage in the data ingestion service 305.

After data ingestion service 305, a data preprocessing service preprocesses the data to prepare the data for use in the lifecycle 300 and includes at least data cleaning, data transformation, and data selection operations. The data preprocessing service 310 removes irrelevant data (data cleaning) and general preprocessing to transform the data into a usable form. In some examples, the data preprocessing service 310 may convert 3D LIDAR data (e.g., 3D point cloud data) into voxels. The data preprocessing service 310 includes labelling of features relevant to the ML model such as people, vegetation, vehicles, and structural objects in the case of an AV. In some examples, the data preprocessing service 310 may be a semi-supervised process performed by a ML to clean and annotate data that is complemented with manual operations such as labeling of error scenarios, identification of untrained features, etc.

After the data preprocessing service 310, data segregation service 315 to separate data into at least a training dataset 320, a validation dataset 325, and a test dataset 330. Each of the training dataset 320, a validation dataset 325, and a test dataset 330 are distinct and do not include any common data to ensure that evaluation of the ML model is isolated from the training of the ML model.

The training dataset 320 is provided to a model training service 335 that uses a supervisor to perform the training, or the initial fitting of parameters (e.g., weights of connections between neurons in artificial neural networks) of the ML model. The model training service 335 trains the ML model based a gradient descent or stochastic gradient descent to fit the ML model based on an input vector (or scalar) and a corresponding output vector (or scalar).

After training, the ML model is evaluated at a model evaluation service 340 using data from the validation dataset 325 and different evaluators to tune the hyperparameters of the ML model. The predictive performance of the ML model is evaluated based on predictions on the validation dataset 325 and iteratively tunes the hyperparameters based on the different evaluators until a best fit for the ML model is identified. After the best fit is identified, the test dataset 330, or holdout data set, is used as a final check to perform an unbiased measurement on the performance of the final ML model by the model evaluation service 340. In some cases, the final dataset that is used for the final unbiased measurement can be referred to as the validation dataset and the dataset used for hyperparameter tuning can be referred to as the test dataset.

After the ML model has been evaluated by the model evaluation service 340, an ML model deployment service 345 can deploy the ML model into an application or a suitable device. The deployment can be into a further test environment such as a simulation environment, or into another controlled environment to further test the ML model. In the case of an AV, the ML model can undergo further evaluation inside a simulated environment and, after further validation, can be deployed in the AV. In some examples, the ML model can be implemented as part of the perception stack 112 to detect objects.

After deployment by the ML model deployment service 345, a performance monitor service 350 monitors for performance of the ML model. In some cases, the performance monitor service 350 can also record performance data such as driving data that can be ingested via the data ingestion service 305 to provide further data, additional scenarios, and further enhance the training of ML models.

Figure 4:
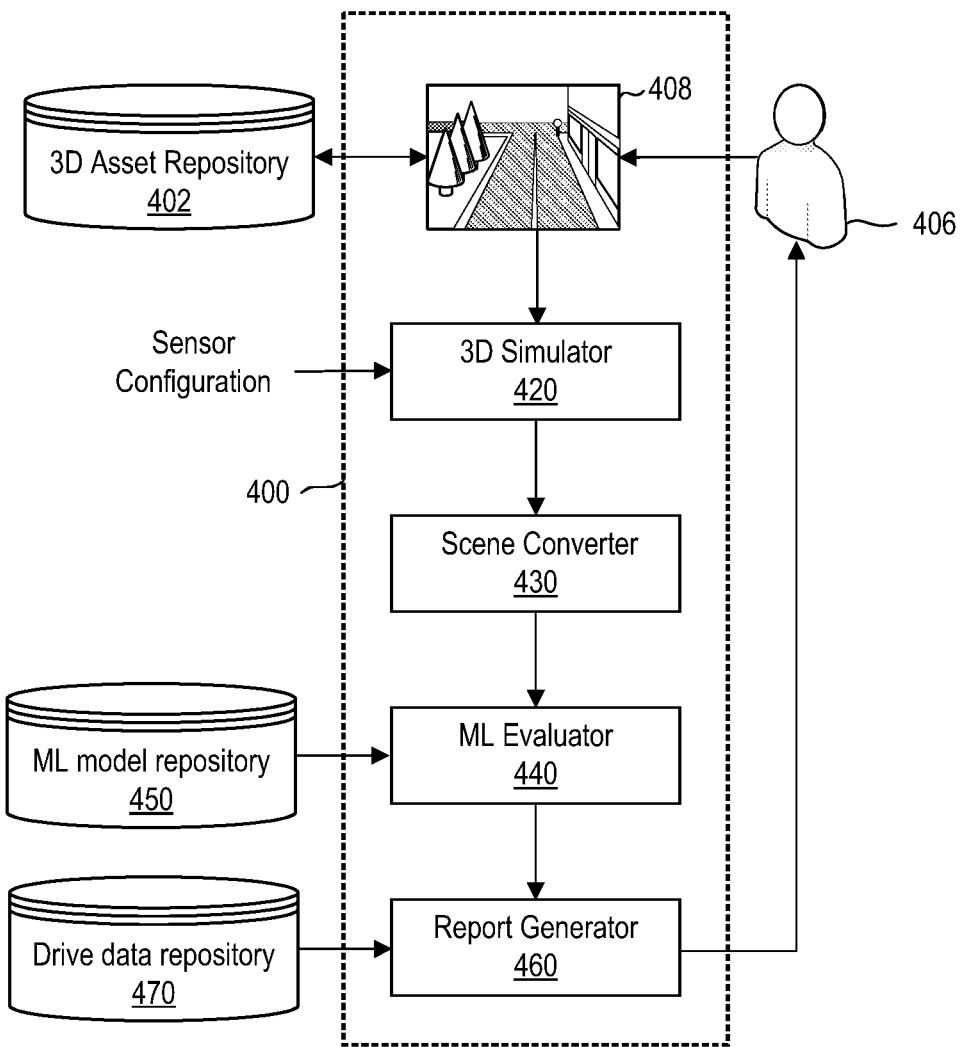
FIG. 4 illustrates a three-dimensional (3D) asset evaluation system for improving 3D assets used by a 3D simulator in accordance with some examples.

FIG. 4 illustrates a 3D asset evaluation system 400 for improving 3D assets used by a 3D simulator in accordance with some examples. In some examples, an ML model may perform differently on physical world data and simulated data, and the difference between the perception and simulation performance can reduce the effectiveness of simulation. Simulation is important because uncommon scenarios can be synthesized, and further ML models can be trained and evaluated using a combination of physical world data (e.g., data recorded by an AV) and simulated data. The 3D asset evaluation system 400 is configured to provide a feedback loop to quickly evaluate 3D assets and close the gap between ML model performance of physical world environments and simulated environments.

The 3D asset evaluation system can be coupled with a 3D asset repository 402 that serves a centralized storage medium for 3D virtual assets (e.g., a 3D model of a tree) that can be used in 3D scenes to evaluate an ML model for navigating an AV. The 3D asset repository 402 can be configured as a database, a web service, a web application or other suitable interface that interconnects with the 3D asset evaluation system 400 and provides a continuous integration pipeline (e.g., a toolchain) for testing and evaluating assets. The 3D asset repository 402 may also be configured as part of a continuous integration pipeline for other aspects such as simulation of an ML model or validation of an ML model.

The 3D asset evaluation system 400 includes a user interface (UI) (e.g., a command line interface (CLI), a web-based UI) that allows a user 406 to search for a particular 3D asset within the context of an ML model used by an AV. For example, the user 406 may recreate a 3D scene 408 to evaluate a specific 3D asset. For example, a 3D asset can be vegetation (e.g., trees, bush, etc.), people, animals, fixed objects (e.g., a stop sign, a trash can), etc. The 3D scene 408 can be as complex or as simple as the user 406 desires. Generally, the 3D scene 408 will begin with a simple simulation to reduce simulation complexity and will gradually increase in complexity based on feedback provided by the 3D asset evaluation system 400.

The user 406 can configure various aspects of the 3D scene 408 such as positioning of the object, physical parameters of the object, material parameters of the object, and so forth. The 3D scene 408 at this point is a mathematical representation and must be rendered into a scene itself to evaluate the ML performance. Accordingly, the 3D scene 408 is input into a 3D simulator 420 that is configured to perform a reconstruction of the 3D scene 408 based on a sensor. The sensor can change and can simulate various aspects such as lighting using a camera, distance information using a LIDAR, or other types of information. For example, an imaging sensor (e.g., a camera) uses light and color and the 3D sensor would simulate the appearance of the 3D scene 408 based on atmospheric lighting and other light sources. A LIDAR sensor would project the infrared or ultraviolet rays into the 3D world and measure the return of the infrared or ultraviolet rays to the LIDAR sensor to measure distance information to reflected surfaces in the 3D scene 408. In some example, the 3D simulator 420 can be configured to simulate multiple sensors in parallel to identify relationships between the different sensors and the 3D simulated scene.

In some examples, the 3D simulator 420 can receive sensor configuration information to assist in simulating the environment. The configuration information includes electrical parameters such as LIDAR intensity, but can also include other information such as mechanical properties that can affect LIDAR such as vibration, etc.

Based on the 3D scene 408 input into the 3D simulator 420 and the sensor configuration input into the 3D simulator 420, the 3D simulator 420 simulates the 3D scene 408 based on movement in the scene (by the sensor or other objects) and generates simulation data based on the sensors. For example, a light sensor such as camera system may generate two-dimensional (2D) image representations of a scene and the 3D simulator 420 may implement a plurality of cameras that use a light projection technique (e.g., ray casting, ray tracing, etc.) to render a scene based on a position and orientation of each camera. In this example, each camera would generate a plurality of 2D images that change over time. In other examples, a LIDAR sensor emits light and receives reflected light to generates distance information such as a 3D point cloud information. The 3D point cloud information identifies relationships to other surfaces in the 3D scene 408 as distances and intensity of reflections, and the 3D point cloud can be segmented into frames at different times that would illustrate movement when visualized.

The output of the 3D simulator 420 may not be directly compatible with the ML model and a scene converter 430 may be implemented to format the output of the 3D simulator 420 based on the type of input for the ML. For example, the distance and intensity information from a LIDAR sensor is a huge volume of data and the distance and intensity information may be converted into voxels and then input into an ML model that accepts voxels. In the case of image sensors, the images from the 3D simulator 420 may be preprocessed based on the ML model. In some cases, the ML model has a limited compute budget and therefore, some simplifications may be needed to the inputs. The scene converter 430 formats the output of the 3D simulator 420 to be compatible with an ML model.

The formatted output of the scene converter 430 is provided to an ML evaluator 440 that receives one or more ML models from an ML model repository 450. The ML model repository 450 is a component of various continuous integration pipelines and is configured to store various ML models, such as previously trained ML models, that can be used and integrated into various toolchains and perform a specific function. For example, an ML model can be configured to perform semantic segmentation for LIDAR data, a different ML model can perform object detection from 2D images, etc. In some examples, the combination of the various ML models can be integrated into the various components of an AV such as a prediction stack 116, a planning stack 118, the control stack 122.

The ML evaluator 440 feeds the formatted output of the scene converter 430 into an ML model, which is selected by a user or an integrated test, over time to execute at least one function associated that the selected ML model is trained for. The ML evaluator 440 record the output from the selected ML model, in effect performing a simulated test of the ML model using a simulated sensor.

The data from the ML evaluator 440 is provided to a report generator 460, which is configured to compare the data from the ML evaluator 440 to drive data, which can be selected by a user or other input (e.g., an integrated test), from a drive data repository 470. The report generator 460 is configured to compare the evaluation of the ML evaluator 440 to the selected drive data and generate a report that identifies metrics associated with a comparison of the ML model in the physical environment (e.g., the selected drive data) to the 3D asset in the simulated environment.

The drive data repository 470 may store various drive data that are selected and curated based on various scenarios, from simple to complex. In some cases, an AV may navigate a physical environment and may record the events that occur, such as a person walking across a street, a person double parking by a school, a car performing an illegal U-turn, etc. The 3D asset evaluation system 400 may be configured to use a specific drive data for the report and, in some examples, the drive data can at least partially correspond to the 3D scene 408.

In some cases, the report can be a simple metrics report that identifies one or more metrics associated with the 3D asset of interest. The report can be a text-based output or a text formatted output (e.g., JavaScript object notation (JSON), etc.) that maps a unique identifier of the asset to a label associated with the 3D scene 408 and can be parsed by a human or a computer. In other examples, the report can be one or more visualizations of the scene with graphics, identifiers, and labels for the user 406 to understand performance of the 3D asset with respect to the physical environment. The user 406 can use the report to modify the 3D asset to improve further simulations.

The 3D asset evaluation system 400 provides a pipeline to modify 3D assets from the 3D asset repository 402 to correspond to how the selected ML model perceives a corresponding object in the physical environment. In some cases, the 3D asset evaluation system 400 reduces the complexity of simulations, decreases the time to analyze the 3D assets, and provides metrics that allows the user 406 to quickly iterate and improve the various 3D assets. The accuracy of the 3D asset with respect to the ML model in the simulated environment is important because the ML model can be trained or evaluated based on simulation data, and improving the 3D assets and their performance in the simulated environment is important. For example, to facilitate training of an ML model or to evaluate the training of an ML model, uncommon scenarios in the real world can be simulated. Reducing the gap between the simulated 3D assets and their perception by the physical sensor increases the realism of the simulation and improves ML training and evaluation. In turn, this improves the ML model development and the accuracy of the various ML models deployed in an AV.

In some examples, the ML evaluator 440 may be configured to perform multiple evaluations of a single 3D scene 408 to evaluate performance of different ML models. The user 406 can use the performance of different ML models to better understand how to create various 3D assets that will work across different ML models, which increases the lifespan of the 3D assets and prevents continual modification of the 3D assets.

FIG. 5 is a flowchart of a method performed by a 3D asset evaluation system for improving 3D assets used by a 3D simulator according to an example of the instant disclosure. Although the example method 500 depicts a particular sequence of operations, the sequence may be altered without departing from the scope of the present disclosure. For example, some of the operations depicted may be performed in parallel or in a different sequence that does not materially affect the function of the method 500. In other examples, different components of an example device or system that implements the method 500 may perform functions at substantially the same time or in a specific sequence. In some examples, the method 500 may be performed in part or in whole by a computing system 600 illustrated in FIG. 6. In some cases, parts of the method 500 may be performed by different systems that are designed for various tasks. For example, a 3D simulation may be performed by a distributed system that includes many computing systems or many graphical processing units (GPUs) that perform mathematical computations in parallel.

According to some examples, the method 500 includes receiving drive data recorded in a physical environment by a vehicle having a sensor at block 505. For example, the computing system 600 may receive drive data recorded in a physical environment by a vehicle having a first sensor.

According to some examples, the method 500 includes receiving (e.g., by the computing system) sensor simulation information related to the sensor for the simulation at block 510. In some examples, the sensor is a LIDAR sensor that records distance information or the sensor is an image sensor that records 2D images. The sensor simulation information can further include information related to the sensors, such as position of the multiple image sensors, modeling characteristics of the sensors, etc. In some examples, the simulation can be performed a combination of different sensors and the sensor simulation information can include information associated with each sensor According to some examples, the method 500 includes simulating (e.g., by the computing system 600) a sensor (which is can be attached to an AV) in a virtual environment of a 3D scene including an object that at least partially corresponds to the physical environment at block 515. In some examples, the simulation of the sensor may be performed in the cloud (e.g., a private cloud system, a public cloud system, a hybrid cloud system, etc.) that parallelizes computations and can perform the simulation with greater speed than a single computing system. In other examples, the computing system 600 may include a GPU array and can perform the simulation.

In some examples, the simulation may be modified to include a virtual autonomous vehicle in the virtual environment that makes determinations based on the first sensor. The simulated data is based on the sensor simulation information and the first sensor. The simulation of the virtual autonomous vehicle in the virtual environment is further performed based on the second senor.

According to some examples, the method 500 includes generating (e.g., by the computing system 600) labels for the simulated data based on the sensor simulation information and the first sensor at block 520.

According to some examples, the method 500 includes converting (e.g., by the computing system 600) the simulated data to correspond to an input based on a type of the sensor at block 525. After converting the simulated data into the correct input, the method 500 includes evaluating (e.g., by the computing system 600) simulated data based on the simulation of the sensor using a ML model at block 530. For example, the ML model can be a semantic segmentation function, an object detection function for identifying various objects 2D images, etc. The various ML models that can be implemented in an autonomous vehicle for navigating in the physical environment and provide low-latency output to facilitate navigating the physical environment.

According to some examples, the method 500 includes comparing (e.g., by the computing system 600) data recorded during the evaluation of the simulation of sensor using the ML model to the drive data recorded in the physical environment at block 535. In some examples, the simulated scene can at least partially correspond to the drive data recorded in the physical environment. This allows the simulation to be compared to data determined by the corresponding ML model to evaluate differences between simulation and performance.

According to some examples, the method 500 includes generating (e.g., by the computing system 600) a report based on a comparison of the data to a portion of the drive data to determine metrics associated with the object in the virtual environment at block 540. The report is a visual depiction of at least one 3D asset in the virtual environment and a metric that identifies a correlation of the at least one 3D asset and an object in the drive data. The report identifies a correlation of a physical object in the physical environment to a 3D asset in the virtual environment. In some examples, the report identifies a classification of a 3D asset in the virtual environment.

In some examples, the 3D assets can be tuned to perform to be equivalent to the real-world performance and the 3D assets can then be used in simulated scenes to train and evaluate subsequent ML models. After updated ML models are trained and validated using 3D assets created with the method 500 (e.g., using the 3D asset evaluation system 400), the updated ML model can be deployed in the autonomous vehicle for recording drive data in physical environments.

In some examples, the method 500 can include additional iterations to allow a user (e.g., the user 406) (and/or a computing system) to modify the 3D assets to reduce the differences between the physical performance as compared to the simulated performance. In this case, the method 500 would further include receiving an updated virtual environment of the 3D scene (e.g., updated by the user 406) that at least partially corresponds to the physical environment and simulating the sensor in the updated virtual environment. After simulation, the method 500 could further comprise evaluating simulated data using the ML model, comparing the updated data recorded during the evaluation of the simulation of the virtual autonomous vehicle using the ML model to the drive data recorded in the physical environment, and generating an updated report. The user 406 may then continue to tune the 3D assets and repeat this process until the user 406 is satisfied with simulated performance as compared to measured performance of the sensor. The user 406 could then perform a process (e.g., check in) the 3D asset into a suitable storage (e.g., the 3D asset repository 402).

FIG. 6 shows an example of computing system 600, which can be for example any computing device making up the 3D asset evaluation system 400, or any component thereof in which the components of the system are in communication with each other using connection 605. Connection 605 can be a physical connection via a bus, or a direct connection into processor 610, such as in a chipset architecture. Connection 605 can also be a virtual connection, networked connection, or logical connection.

In some embodiments, computing system 600 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example computing system 600 includes at least one processing unit (CPU or processor) 610 and connection 605 that couples various system components including system memory 615, such as read-only memory (ROM) 620 and random access memory (RAM) 625 to processor 610. Computing system 600 can include a cache of high-speed memory 612 connected directly with, in close proximity to, or integrated as part of processor 610.

Processor 610 can include any general purpose processor and a hardware service or software service, such as services 632, 634, and 636 stored in storage device 630, configured to control processor 610 as well as a special-purpose processor where software instructions are incorporated into the actual processor design. Processor 610 may essentially be a completely self-contained computing system, containing multiple cores or processors, a bus, memory controller, cache, etc. A multi-core processor may be symmetric or asymmetric.

To enable user interaction, computing system 600 includes an input device 645, which can represent any number of input mechanisms, such as a microphone for speech, a touch-sensitive screen for gesture or graphical input, keyboard, mouse, motion input, speech, etc. Computing system 600 can also include output device 635, which can be one or more of a number of output mechanisms known to those of skill in the art. In some instances, multimodal systems can enable a user to provide multiple types of input/output to communicate with computing system 600. Computing system 600 can include communications interface 640, which can generally govern and manage the user input and system output. There is no restriction on operating on any particular hardware arrangement, and therefore the basic features here may easily be substituted for improved hardware or firmware arrangements as they are developed.

Storage device 630 can be a non-volatile memory device and can be a hard disk or other types of computer readable media which can store data that are accessible by a computer, such as magnetic cassettes, flash memory cards, solid state memory devices, digital versatile disks, cartridges, RAMs, ROM, and/or some combination of these devices.

The storage device 630 can include software services, servers, services, etc., that when the code that defines such software is executed by the processor 610, it causes the system to perform a function. In some embodiments, a hardware service that performs a particular function can include the software component stored in a computer-readable medium in connection with the necessary hardware components, such as processor 610, connection 605, output device 635, etc., to carry out the function.

The computing system 600 can also include a GPU array 650 or any similar processor for performing massively complex and parallel mathematical operations such as simulations, games, neural network training, and so forth. The GPU array 650 includes at least one GPU and is illustrated to have three GPUs comprising GPU 652, GPU 654, and GPU 656. However, the GPU array 650 can be any number of GPUs. In some examples, the GPU core can be integrated into a die of the processor 610.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative examples of the disclosure include:

Aspect 1. A method, comprising: receiving drive data recorded in a physical environment by a vehicle having a first sensor; simulating the first sensor associated with a virtual autonomous vehicle in a virtual environment of a three-dimensional (3D) scene including an object that at least partially corresponds to the physical environment; evaluating simulated data based on the simulation of the first sensor using a machine learning (ML) model for navigating an autonomous vehicle in the physical environment; comparing evaluation data recorded during the evaluation of the simulation of the first sensor using the ML model to the drive data recorded in the physical environment; and generating a report based on a comparison of the evaluation data to a portion of the drive data to determine metrics associated with the object in the virtual environment.

Aspect 2. The method of Aspect 1, further comprising: receiving sensor simulation information related to the first sensor for the simulation, and wherein the simulated data has a format corresponding to a type of the first sensor.

Aspect 3. The method of any of Aspects 1 to 2, further comprising: generating labels for the simulated data based on the sensor simulation information and the first sensor.

Aspect 4. The method of any of Aspects 1 to 3, further comprising: converting the simulated data to correspond to an input based on a type of the first sensor.

Aspect 5. The method of any of Aspects 1 to 4, wherein the first sensor comprises a light detection and ranging (LIDAR) sensor that records distance information.

Aspect 6. The method of any of Aspects 1 to 5, further comprising: receiving an updated virtual environment of the 3D scene that at least partially corresponds the physical environment, wherein the object in the virtual environment was modified based on the report; simulating the first sensor in the updated virtual environment; evaluating simulated data based on the simulation of the first sensor using the ML model; comparing updated data recorded during the evaluation of the simulation of the first sensor using the ML model to the drive data recorded in the physical environment; and generating an updated report based on a comparison of the updated data to the portion of the drive data to determine metrics associated the object in the virtual environment.

Aspect 7. The method of any of Aspects 1 to 6, wherein the sensor simulation information further includes information related to a second sensor for the simulation, wherein the simulation of the virtual autonomous vehicle in the virtual environment is further performed based on the second senor.

Aspect 8. The method of any of Aspects 1 to 7, wherein the report is a visual depiction of at least one 3D asset in the virtual environment and a metric that identifies a correlation of the at least one 3D asset and an object in the drive data, wherein the object is used in simulated scenes to validate an updated ML model, and wherein the updated ML model is deployed in the autonomous vehicle for recording drive data in physical environments.

Aspect 9. The method of any of Aspects 1 to 8, wherein the report identifies a correlation of a physical object in the physical environment to the object in the virtual environment.

Aspect 10. The method of any of Aspects 1 to 9, wherein the report identifies a classification of the object in the virtual environment.

Aspect 11: A system includes a storage (implemented in circuitry) configured to store instructions and a processor. The processor configured to execute the instructions and cause the processor to: receive drive data recorded in a physical environment by a vehicle having a first sensor; simulate the first sensor associated with a virtual autonomous vehicle in a virtual environment of a three-dimensional (3D) scene including an object that at least partially corresponds to the physical environment; evaluate simulated data based on the simulation of the first sensor using a machine learning (ML) model for navigating an autonomous vehicle in the physical environment; compare evaluation data recorded during the evaluation of the simulation of the first sensor using the ML model to the drive data recorded in the physical environment; and generate a report based on a comparison of the evaluation data to a portion of the drive data to determine metrics associated with the object in the virtual environment.

Aspect 12: The system of Aspect 11, wherein the processor is configured to execute the instructions and cause the processor to: receive sensor simulation information related to the first sensor for the simulation, and wherein the simulated data has a format corresponding to a type of the first sensor.

Aspect 13: The system of any of Aspects 11 to 12, wherein the processor is configured to execute the instructions and cause the processor to: generate labels for the simulated data based on the sensor simulation information and the first sensor.

Aspect 14: The system of any of Aspects 11 to 13, wherein the processor is configured to execute the instructions and cause the processor to: convert the simulated data to correspond to an input based on a type of the first sensor.

Aspect 15: The system of any of Aspects 11 to 14, wherein the first sensor comprises a light detection and ranging (LIDAR) sensor that records distance information.

Aspect 16: The system of any of Aspects 11 to 15, wherein the processor is configured to execute the instructions and cause the processor to: receive an updated virtual environment of the 3D scene that at least partially corresponds the physical environment, wherein the object in the virtual environment was modified based on the report; simulate the first sensor in the updated virtual environment; evaluate simulated data based on the simulation of the first sensor using the ML model; compare updated data recorded during the evaluation of the simulation of the first sensor using the ML model to the drive data recorded in the physical environment; and generate an updated report based on a comparison of the updated data to the portion of the drive data to determine metrics associated the object in the virtual environment.

Aspect 17: The system of any of Aspects 11 to 16, wherein the sensor simulation information further includes information related to a second sensor for the simulation, wherein the simulation of the virtual autonomous vehicle in the virtual environment is further performed based on the second senor.

Aspect 18: The system of any of Aspects 11 to 17, wherein the report is a visual depiction of at least one 3D asset in the virtual environment and a metric that identifies a correlation of the at least one 3D asset and an object in the drive data, wherein the object is used in simulated scenes to validate an updated ML model, and wherein the updated ML model is deployed in the autonomous vehicle for recording drive data in physical environments.

Aspect 19: The system of any of Aspects 11 to 18, wherein the report identifies a correlation of a physical object in the physical environment to the object in the virtual environment.

Aspect 20: The system of any of Aspects 11 to 19, wherein the report identifies a classification of the object in the virtual environment.

Aspect 21: A computer readable medium comprising instructions using a computer system. The computer includes a memory (e.g., implemented in circuitry) and a processor (or multiple processors) coupled to the memory. The processor (or processors) is configured to execute the computer readable medium and cause the processor to: receive drive data recorded in a physical environment by a vehicle having a first sensor; simulate the first sensor associated with a virtual autonomous vehicle in a virtual environment of a three-dimensional (3D) scene including an object that at least partially corresponds to the physical environment; evaluate simulated data based on the simulation of the first sensor using a machine learning (ML) model for navigating an autonomous vehicle in the physical environment; compare evaluation data recorded during the evaluation of the simulation of the first sensor using the ML model to the drive data recorded in the physical environment; and generate a report based on a comparison of the evaluation data to a portion of the drive data to determine metrics associated with the object in the virtual environment.

Aspect 22: The computer readable medium of Aspect 21, wherein the processor is configured to execute the computer readable medium and cause the processor to: receive sensor simulation information related to the first sensor for the simulation, and wherein the simulated data has a format corresponding to a type of the first sensor.

Aspect 23: The computer readable medium of any of Aspects 21 to 22, wherein the processor is configured to execute the computer readable medium and cause the processor to: generate labels for the simulated data based on the sensor simulation information and the first sensor.

Aspect 24: The computer readable medium of any of Aspects 21 to 23, wherein the processor is configured to execute the computer readable medium and cause the processor to: convert the simulated data to correspond to an input based on a type of the first sensor.

Aspect 25: The computer readable medium of any of Aspects 21 to 24, wherein the first sensor comprises a light detection and ranging (LIDAR) sensor that records distance information.

Aspect 26: The computer readable medium of any of Aspects 21 to 25, wherein the processor is configured to execute the computer readable medium and cause the processor to: receive an updated virtual environment of the 3D scene that at least partially corresponds the physical environment, wherein the object in the virtual environment was modified based on the report; simulate the first sensor in the updated virtual environment; evaluate simulated data based on the simulation of the first sensor using the ML model; compare updated data recorded during the evaluation of the simulation of the first sensor using the ML model to the drive data recorded in the physical environment; and generate an updated report based on a comparison of the updated data to the portion of the drive data to determine metrics associated the object in the virtual environment.

Aspect 27: The computer readable medium of any of Aspects 21 to 26, wherein the sensor simulation information further includes information related to a second sensor for the simulation, wherein the simulation of the virtual autonomous vehicle in the virtual environment is further performed based on the second senor.

Aspect 28: The computer readable medium of any of Aspects 21 to 27, wherein the report is a visual depiction of at least one 3D asset in the virtual environment and a metric that identifies a correlation of the at least one 3D asset and an object in the drive data, wherein the object is used in simulated scenes to validate an updated ML model, and wherein the updated ML model is deployed in the autonomous vehicle for recording drive data in physical environments.

Aspect 29: The computer readable medium of any of Aspects 21 to 28, wherein the report identifies a correlation of a physical object in the physical environment to the object in the virtual environment.

Aspect 30: The computer readable medium of any of Aspects 21 to 29, wherein the report identifies a classification of the object in the virtual environment.

What is claimed is:

1. A method, comprising:
receiving drive data recorded in a physical environment by a vehicle having a first sensor;
simulating the first sensor associated with a virtual autonomous vehicle in a virtual environment of a three-dimensional (3D) scene including an object that at least partially corresponds to the physical environment;
evaluating simulated data based on the simulation of the first sensor using a machine learning (ML) model for navigating an autonomous vehicle in the physical environment;
comparing evaluation data recorded during the evaluation of the simulation of the first sensor using the ML model to the drive data recorded in the physical environment;
determining, based on a comparison of the evaluation data to a portion of the drive data, metrics associated with a perception of the object in the virtual environment by the ML model and a perception of a corresponding physical object in the physical environment by the ML model;
generating a report comprising the metrics;
modifying or maintaining a 3D asset corresponding to the object in the virtual environment, based on the metrics, wherein:
modifying the 3D asset comprises modifying a correlation between the perception of the object in the virtual environment by the ML model and the perception of the corresponding physical object in the physical environment by the ML model; and
maintaining the 3D asset comprises maintaining the correlation;
receiving second drive data recorded in the physical environment by the autonomous vehicle;
predicting, based on the second drive data and using the ML model and the 3D asset, a future event associated with at least the corresponding physical object in the physical environment; and
navigating the autonomous vehicle in the physical environment, based on predicting the future event.

2. The method of claim 1, further comprising:
receiving sensor simulation information related to the first sensor for the simulation, and wherein the simulated data has a format corresponding to a type of the first sensor.

3. The method of claim 2, further comprising:
generating labels for the simulated data based on the sensor simulation information and the first sensor.

4. The method of claim 2, further comprising:
converting the simulated data to correspond to an input based on a type of the first sensor.

5. The method of claim 2, wherein the first sensor comprises a light detection and ranging (LIDAR) sensor that records distance information.

6. The method of claim 2, further comprising:
receiving an updated virtual environment of the 3D scene that at least partially corresponds the physical environment, wherein the object in the virtual environment was modified based on the report;
simulating the first sensor in the updated virtual environment;
evaluating simulated data based on the simulation of the first sensor using the ML model;

comparing updated data recorded during the evaluation of the simulation of the first sensor using the ML model to the drive data recorded in the physical environment;

determining, based on a comparison of the updated data to the portion of the drive data, updated metrics associated with the perception of the object in the virtual environment by the ML model and the perception of the corresponding physical object in the physical environment by the ML model;

generating an updated report comprising the updated metrics; and modifying or maintaining the 3D asset corresponding to the object in the virtual environment, based on the updated metrics.

7. The method of claim 2, wherein the sensor simulation information further includes information related to a second sensor for the simulation, and wherein the simulation of the virtual autonomous vehicle in the virtual environment is further performed based on the second sensor.

8. The method of claim 1, wherein the report is a visual depiction of at least one 3D asset in the virtual environment and a metric that identifies a correlation of the at least one 3D asset and an object in the drive data, wherein the object is used in simulated scenes to validate an updated ML model, and wherein the updated ML model is deployed in the autonomous vehicle for recording drive data in physical environments.

9. The method of claim 1, wherein the report identifies a correlation of a physical object in the physical environment to the object in the virtual environment.

10. The method of claim 1, wherein the report identifies a classification of the object in the virtual environment.

11. A system comprising:

a storage configured to store instructions;

a processor configured to execute the instructions and cause the processor to:

receive drive data recorded in a physical environment by a vehicle having a first sensor;

simulate the first sensor associated with a virtual autonomous vehicle in a virtual environment of a three-dimensional (3D) scene including an object that at least partially corresponds to the physical environment;

evaluate simulated data based on the simulation of the first sensor using a machine learning (ML) model for navigating an autonomous vehicle in the physical environment;

compare evaluation data recorded during the evaluation of the simulation of the first sensor using the ML model to the drive data recorded in the physical environment;

determine, based on a comparison of the evaluation data to a portion of the drive data, metrics associated with a perception of the object in the virtual environment by the ML model and a perception of a corresponding physical object in the physical environment by the ML model;

generate a report comprising the metrics;

modify or maintain a 3D asset corresponding to the object in the virtual environment, based on the metrics, wherein:

modifying the 3D asset comprises modifying a correlation between the perception of the object in the virtual environment by the ML model and the perception of the corresponding physical object in the physical environment by the ML model; and maintaining the 3D asset comprises maintaining the correlation;

receive second drive data recorded in the physical environment by the autonomous vehicle;

predict, based on the second drive data and using the ML model and the 3D asset, a future event associated with at least the corresponding physical object in the physical environment; and navigate the autonomous vehicle in the physical environment, based on predicting the future event.

12. The system of claim 11, wherein the processor is configured to execute the instructions and cause the processor to:

receive sensor simulation information related to the first sensor for the simulation, and wherein the simulated data has a format corresponding to a type of the first sensor.

13. The system of claim 12, wherein the processor is configured to execute the instructions and cause the processor to:

generate labels for the simulated data based on the sensor simulation information and the first sensor.

14. The system of claim 12, wherein the processor is configured to execute the instructions and cause the processor to:

convert the simulated data to correspond to an input based on a type of the first sensor.

15. The system of claim 12, wherein the first sensor comprises a light detection and ranging (LIDAR) sensor that records distance information.

16. The system of claim 12, wherein the processor is configured to execute the instructions and cause the processor to:

receive an updated virtual environment of the 3D scene that at least partially corresponds the physical environment, wherein the object in the virtual environment was modified based on the report;

simulate the first sensor in the updated virtual environment;

evaluate simulated data based on the simulation of the first sensor using the ML model; compare updated data recorded during the evaluation of the simulation of the first sensor using the ML model to the drive data recorded in the physical environment;

determine, based on a comparison of the updated data to the portion of the drive data, updated metrics associated with the perception of the object in the virtual environment by the ML model and the perception of the corresponding physical object in the physical environment by the ML model;

generate an updated report comprising the updated metrics; and modify or maintain the 3D asset corresponding to the object in the virtual environment, based on the updated metrics.

17. The system of claim 12, wherein the sensor simulation information further includes information related to a second sensor for the simulation, and wherein the simulation of the virtual autonomous vehicle in the virtual environment is further performed based on the second sensor.

18. The system of claim 11, wherein the report is a visual depiction of at least one 3D asset in the virtual environment and a metric that identifies a correlation of the at least one 3D asset and an object in the drive data, wherein the object is used in simulated scenes to validate an updated ML model, and wherein the updated ML model is deployed in the autonomous vehicle for recording drive data in physical environments.

19. The system of claim 11, wherein the report identifies a correlation of a physical object in the physical environment to the object in the virtual environment.

20. A non-transitory computer readable medium comprising instructions, the instructions, when executed by a computing system, cause the computing system to:

receive drive data recorded in a physical environment by a vehicle having a first sensor;

simulate the first sensor associated with a virtual autonomous vehicle in a virtual environment of a three-dimensional (3D) scene including an object that at least partially corresponds to the physical environment;

evaluate simulated data based on the simulation of the first sensor using a machine learning (ML) model for navigating an autonomous vehicle in the physical environment;

compare evaluation data recorded during the evaluation of the simulation of the first sensor using the ML model to the drive data recorded in the physical environment;

determine, based on a comparison of the evaluation data to a portion of the drive data, metrics associated with a perception of the object in the virtual environment by the ML model and a perception of a corresponding physical object in the physical environment by the ML model;

generate a report comprising the metrics;

modify or maintain a 3D asset corresponding to the object in the virtual environment, based on the metrics, wherein:

modifying the 3D asset comprises modifying a correlation between the perception of the object in the virtual environment by the ML model and the perception of the corresponding physical object in the physical environment by the ML model; and maintaining the 3D asset comprises maintaining the correlation;

receive second drive data recorded in the physical environment by the autonomous vehicle;

predict, based on the second drive data and using the ML model and the 3D asset, a future event associated with at least the corresponding physical object in the physical environment; and navigate the autonomous vehicle in the physical environment, based on predicting the future event.

\*  \*  \*  \*  \*